US010796750B2

United States Patent
Arsovski et al.

(10) Patent No.: US 10,796,750 B2
(45) Date of Patent: Oct. 6, 2020

(54) SEQUENTIAL READ MODE STATIC RANDOM ACCESS MEMORY (SRAM)

(71) Applicant: GLOBALFOUNDRIES INC., Grand Cayman (KY)

(72) Inventors: Igor Arsovski, Williston, VT (US); Akhilesh Patil, South Burlington, VT (US); Eric D. Hunt-Schroeder, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/031,439

(22) Filed: Jul. 10, 2018

(65) Prior Publication Data
US 2020/0020388 A1 Jan. 16, 2020

(51) Int. Cl.
| G11C 7/12 | (2006.01) |
|---|---|
| G11C 11/419 | (2006.01) |
| G11C 11/4074 | (2006.01) |
| G11C 11/4076 | (2006.01) |

(52) U.S. Cl.
CPC .............. *G11C 11/419* (2013.01); *G11C 7/12* (2013.01); *G11C 11/4074* (2013.01); *G11C 11/4076* (2013.01)

(58) Field of Classification Search
CPC ..... G11C 11/419; G11C 11/4076; G11C 7/12; G11C 11/4074
See application file for complete search history.

(56) References Cited

U.S. PATENT DOCUMENTS

| 5,659,515 | A | * | 8/1997 | Matsuo | G11C 11/406 365/222 |
|---|---|---|---|---|---|
| 6,847,570 | B2 | | 1/2005 | Fujioka et al. | |
| 9,613,685 | B1 | | 4/2017 | Seetharaman et al. | |
| 2001/0040827 | A1 | * | 11/2001 | Dosaka | G11C 7/10 365/189.011 |
| 2005/0226081 | A1 | * | 10/2005 | Kajitani | G11C 11/4076 365/230.03 |
| 2016/0163379 | A1 | * | 6/2016 | Roine | G11C 11/4094 365/154 |

OTHER PUBLICATIONS

"Understanding Burst Modes in Single Data Rate Synchronous SRAMs", Cypress Perform, Aug. 10, 2011, Document No. 001-22619, 4 pages.
Taiwanese Office Action and Search Report in related TW Application No. 108119750 dated Apr. 23, 2020, 13 pages.

* cited by examiner

*Primary Examiner* — Mohammed A Bashar
(74) *Attorney, Agent, or Firm* — Michael Le Strange; Andrew M. Calderon; Roberts Calderon Safran & Cole, P.C.

(57) ABSTRACT

The present disclosure relates to a structure including a sequential mode read controller which is configured to receive a sequential read enable burst signal and a starting word line address, identify consecutive read operations from an array of storage cells accessed via a plurality of word lines, precharge a plurality of bit lines of the storage cells no more than once during the consecutive read operations, and hold a word line of the word lines active throughout the consecutive read operations. The sequential read enable burst signal and a starting word line address are decoded to select a row address and activate the corresponding word line from a plurality of word lines in the array.

20 Claims, 7 Drawing Sheets

SEQUENTIAL READ MODE STATIC RANDOM ACCESS MEMORY (SRAM)

FIELD OF THE INVENTION

The present disclosure relates to a sequential read mode in a static random access memory, and more particularly, to a circuit and a method for using a burst mode in a static random access memory to save power and improve performance associated with address switching and decoding.

BACKGROUND

Memory devices are employed as internal storage areas in a computer or other electronic equipment. One specific type of memory used to store data in a computer is random access memory (RAM). RAM is typically used as a main memory in a computer environment, and is generally volatile in that once power is turned off all data stored in the RAM is lost.

A static random access memory (SRAM) is one example of a RAM. An SRAM has the advantage of holding data without a need for refreshing. A typical SRAM device includes an array of individual SRAM cells. Each SRAM cell is capable of storing a binary voltage value that represents a logical data bit (e.g., "0" or "1").

In SRAM, energy efficiency is a challenge with a need for lower power. For example, typical machine learning applications require lower power as well as faster memory access. In a typical deep neural network hardware, memory is used to store weight parameters and activations as an input propagates through the network. The typical neural network application use SRAMs to store weights and activations. These weights are stored in consecutive (i.e., next to one another) locations to address spatial locality. Further, a typical deep-learning architecture reads full layer matrix in a linear fashion and uses the data to generate the next layer. Applications that require sequential access rather than full random access can achieve power savings and performance enhancement (higher bandwidth) wherein signal is developed on multiple adjacent words in parallel (i.e., multiple columns connected to a single sense amplifier) and control circuitry enables sensing these words consecutively in a burst mode

SUMMARY

In an aspect of the disclosure, a structure includes a sequential mode read controller which is configured to receive a sequential read enable burst signal and a starting word line address, identify consecutive read operations from an array of storage cells accessed via a plurality of word lines, precharge a plurality of bit lines of the storage cells no more than once during the consecutive read operations, and hold a word line of the word lines active throughout the consecutive read operations. The sequential read enable burst signal and a starting word line address are decoded to select a row address and activate the corresponding word line from a plurality of word lines in the array.

In another aspect of the disclosure, a circuit includes an array of storage cells arranged in a plurality of rows and a plurality of columns, and a read controller configured to operate in a burst mode, precharge a plurality of bit lines of the storage cells no more than once during consecutive sequential read operations, and hold a word line of a plurality of word lines active throughout the consecutive sequential read operations. The word lines correspond to the rows and the bit lines correspond to the columns.

In another aspect of the disclosure, a method includes operating a static random access memory (SRAM) in a burst mode, pre-charging a plurality of bit lines in the SRAM no more than once during consecutive sequential read operations, and holding a word line of a plurality of word lines active throughout the consecutive sequential read operations.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a sequential read mode in a static random access memory, and more particularly, to a circuit and a method for using a burst mode in a static random access memory to save power associated with address switching and decoding. More specifically, the present disclosure uses a sequential read method to read out weights, which are stored in adjacent locations (i.e., adjacent columns). Advantageously, the present disclosure reduces power and improves performance of SRAM reads.

When implementing the sequential read method of the present disclosure, address set up timing for the next read operation is reduced since the next column (which is next to the previous read column) is always being read. By not doing the address set up for the next read operations after the first read, the power associated with address switching, updating latches, and decoding is saved. The present disclosure also does not require the word line (WL) to SET signal development timing on the next consecutive read cycles after the first read (signal is already developed on adjacent bit lines).

The present disclosure accomplishes the sequential read method using a burst mode in static random access memory to save power associated with word line WL switching and bit line BL restore across the different multiplexer MUX decode options on a same physical word line. Further, in the present disclosure, burst read increases throughput and burst performance. As the present disclosure includes the word line WL being activated once and the bit lines BLs restored and discharged only once for N reads, power is reduced compared to the conventional circuitry.

Figure 1A:
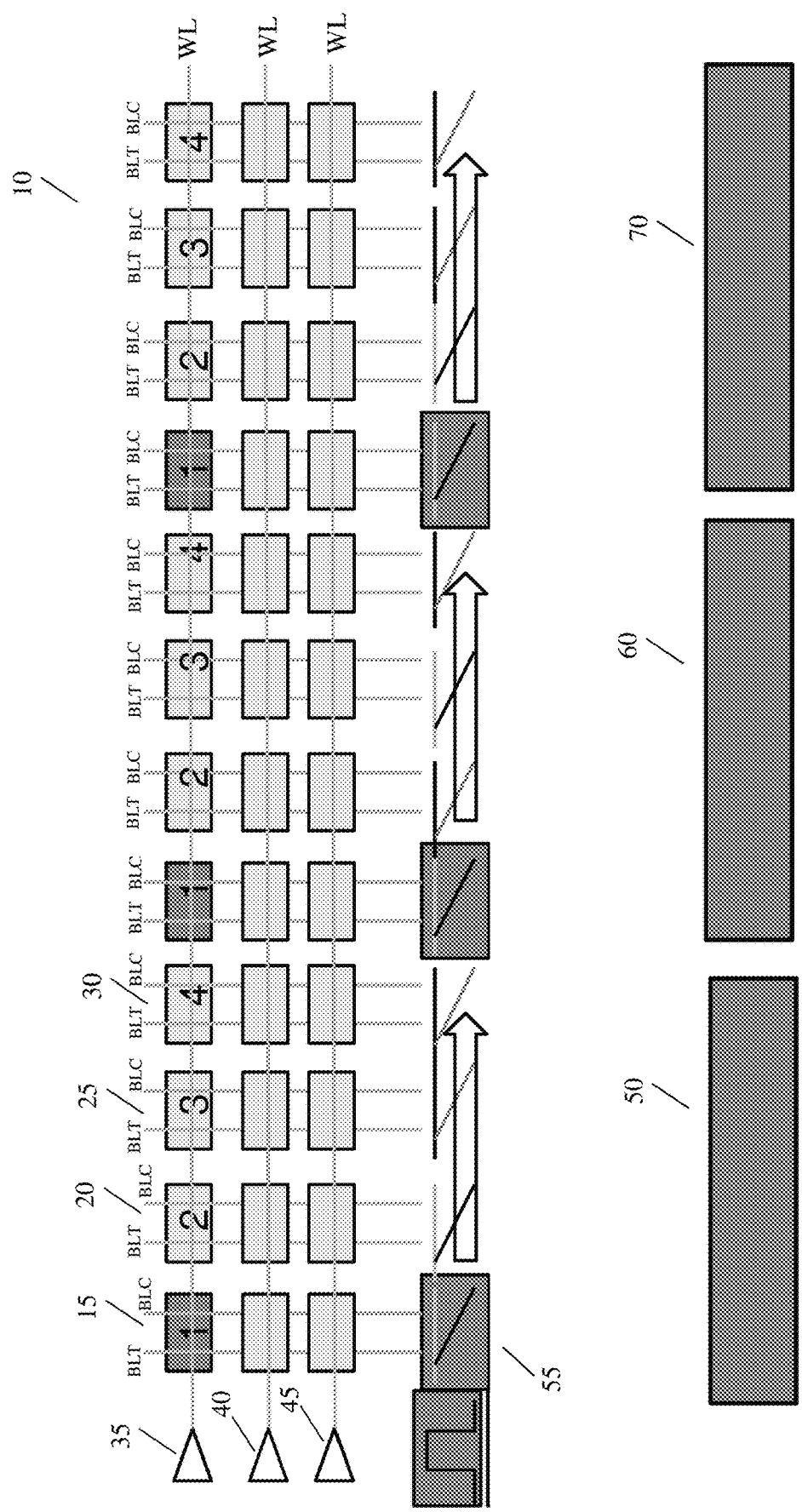
FIG. 1A shows a multiplexer static random access memory read operation in accordance with aspects of the present disclosure.

FIG. 1A shows a multiplexer static random access memory read operation in accordance with aspects of the present disclosure. In FIG. 1A, a system 10 for the multiplexer static random access memory read operation includes an array. The array includes a first column 15 (i.e., represented as "1"), a second column 20 (i.e., represented as "2"), a third column 25 (i.e., represented as "3"), and a fourth column 30 (i.e., represented as "4"). Further, as shown in FIG. 1A, the system 10 repeats the first column 15, the second column 20, the third column 25, and the fourth column 30 for two more sets. Each of the first column 15, the second column 20, the third column 25, and the fourth column 30 receives a word line WL and bit lines BLT and BLC (i.e., true bit line and complement bit line). The system 10 in FIG. 1A also includes a first sense amplifier circuit 50, a second sense amplifier circuit 60, a third sense amplifier circuit 70, a first wordline driver 35, a second wordline driver 40, and a third wordline driver 45 corresponding to three adjacent word lines in the memory array. FIG. 1A shows a basic decode 4 architecture in which the sense amplifier 50 is shared by the columns 15, 20, 25 and 30. Similarly, the sense amplifier 60 is shared by the next consecutive four columns. One skilled in the art would recognize that the four bit line true and complement pairs 15, 20, 25, 30 would connect to data lines true and complement that feed into a shared sense amplifier and outputting a single data output.

In an operation of FIG. 1A, the word line WL is activated once, and then the multiplexer inputs are shifted to read and sense without needing to restore the bit lines BLs. In an example operation, the word line WL is activated and the signal is developed on all the four pairs of true and complement bit lines which correspond with columns 15, 20, 25 and column 30. The multiplexer input is configured to read the first column 15. Reading a column consists of activating the multiplexer/bitswitch to connect a desired column to the sense amplifier data lines, setting the sense amplifier, latching the read data, and restoring the sense amplifier data lines. After the first read on column 15 is completed, a second read is performed for the second column 20. The sense amplifier is reset and the multiplexer is shifted to the adjacent bit line pair corresponding to column 25. The sense and read operation is performed for the third column 25 and the sense amplifier is reset. The multiplexer is shifted to the adjacent column 30 and the sense and read operation is performed for the fourth column 30. The sense amplifier is reset. For the second and third sets, the operation is repeated for the first column 15, the second column 20, the third column 25, and the fourth column 30. For a Mux-X (i.e., X read operations) static random access memory, the claimed invention burns 1 word line WL and 1 bit line BL switching power.

Figure 3:
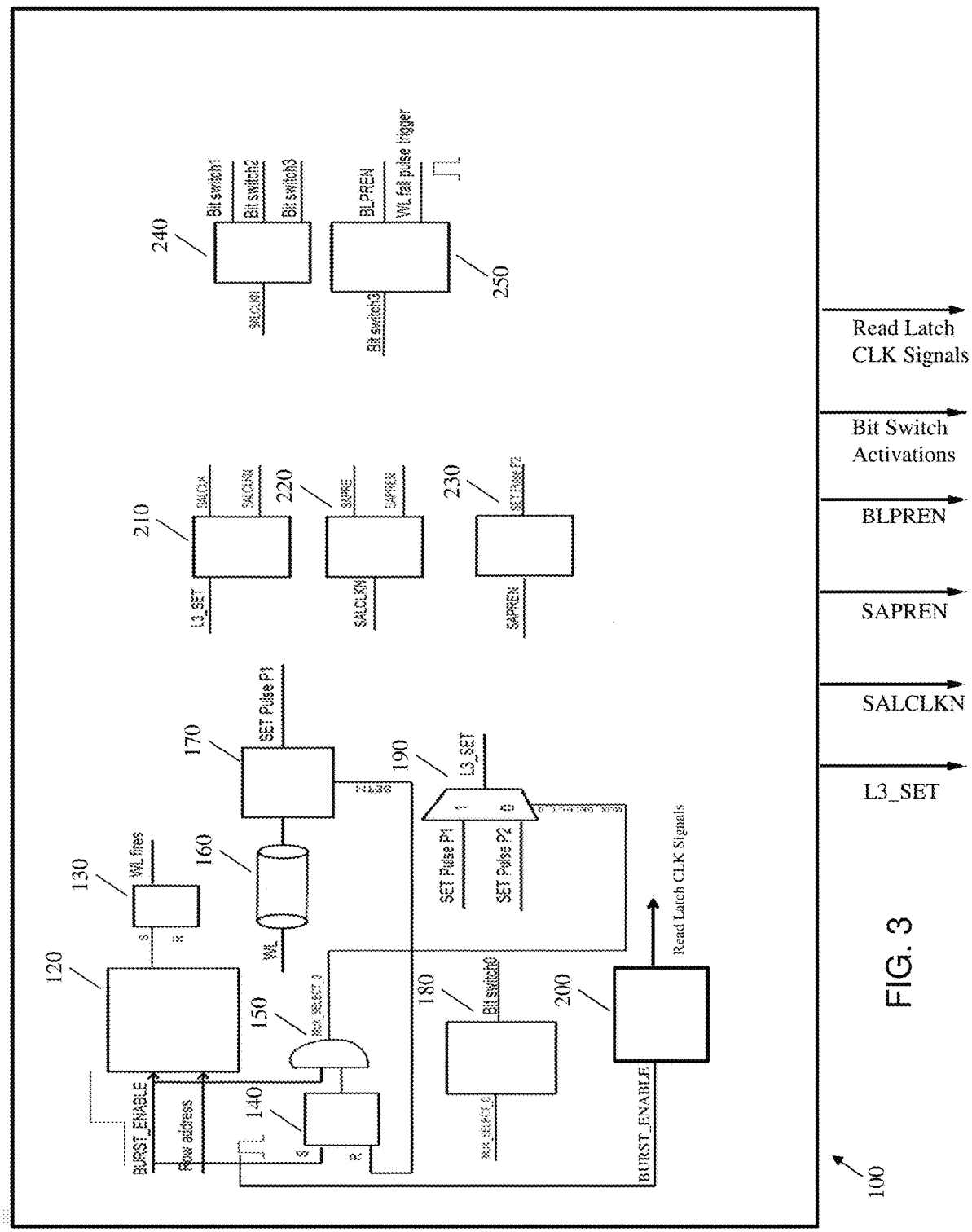
FIG. 3 shows a control block system in the multiplexer static random access memory in accordance with aspects of the present disclosure.

In the example of FIG. 3, a read controller 100 (i.e., a control block system 100) can be configured to receive a signal enabling the sequential read mode and a starting row address. Further, the read controller 100 can be configured to identify consecutive read operations from an array of storage cells accessed via a plurality of word lines and precharge a plurality of bit lines of the storage cells no more than once during the consecutive read operations. In addition, the read controller 100 can be configured to hold a word line of the word lines active throughout the consecutive read operations.

Figure 1B:
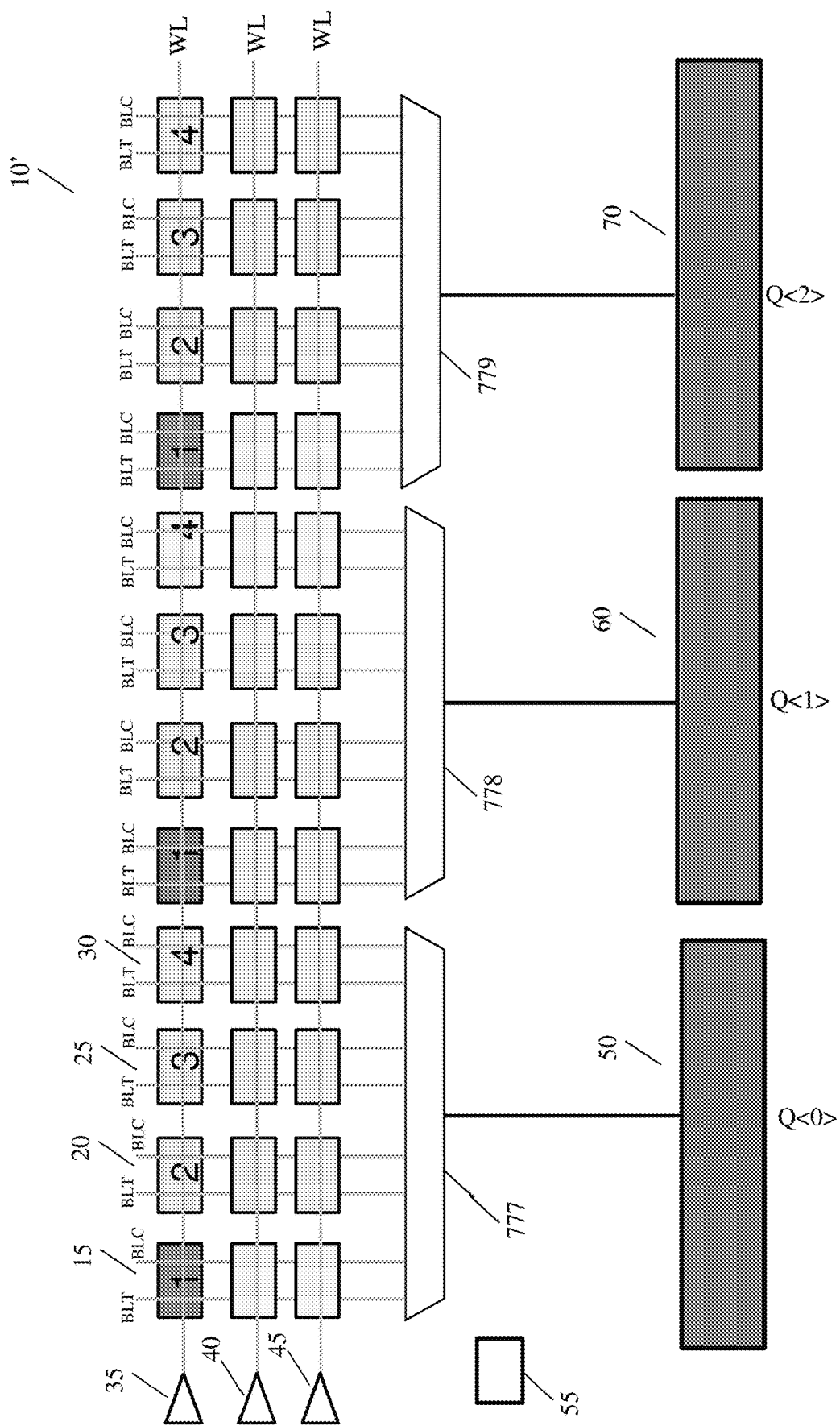
FIG. 1B shows another multiplexer static random access memory read operation in accordance with aspects of the present disclosure.

FIG. 1B shows another multiplexer static random access memory read operation in accordance with aspects of the present disclosure. In FIG. 1B, a system 10' includes an array of memory cells arranged as rows (i.e., word lines) and columns (i.e., bit lines). In the system 10', three word lines are activated by wordline drivers 35, 40, 45 and only one word line is active during a single or burst mode read operation. In the system 10', a plurality of bit line pairs (i.e., bit line true and bit line complement) are fed into a single sense amplifier using a bit switch multiplexer (i.e., one of multiplexers 777, 778, and 779). Further, one of ordinary skill in the art would understand that any number of bit line pairs could be fed into a sense amplifier. In a particular example, two, four, and eight bit line pairs are the most commonly used.

In the system 10' of FIG. 1B, four bit line pairs (i.e., the first column 15, the second column 20, the third column 25, and the fourth column 30) share a single sense amplifier 50 through multiplexer 777. Further, in the system 10', the configuration is replicated for each global bit line (i.e., data line) such that the next group of N (e.g., 4) bit lines is feed to the sense amplifier 60 and the next group of N (e.g., 4) bit lines is fed in to the sense amplifier 70. In the system 10', the output of the sense amplifier 50 is Q<0>, the output of the sense amplifier 60 is Q<1>, and the output of the sense amplifier 70 is Q<2>.

In the system 10' of FIG. 1B, a read controller 55 is used to support a burst mode read operation. The read controller 55 is also used to update the bit switch multiplexers 777, 778, and 779 during a burst mode to iterate through each activate columns 15, 20, 25, and 30 for sensing (i.e., read) by the sense amplifier 50.

In an example of a burst mode operation for a single data line (i.e., Q<0>), a word line is activated by the word line driver 35 and held high (i.e., active) until four read operations are complete. The word line activated by the wordline driver 35 develops a signal (i.e., voltage differential) on the true bit line and complement bit line (i.e., true bit line BLT and complement bit line BLC) on the first column 15, the second column 20, the third column 25, and the fourth column 30. When the word line is high (i.e., active), the SRAM bit cell will drive data onto the bit lines based on the data stored in the bit cell such that only one of the true bit line BLT or complement bit line BLC on a column will discharge towards ground during a read operation. When the word line is activated by the wordline driver 35 and signal is developed on the bit line pairs 15, 20, 25, and 30, the first read operation may take place with the sense amplifier through the multiplexer 777. The read controller 55 selects the first column 15 for a read operation. The sense amplifier 50 senses the voltage differential that exists between the true bit line BLT and the complement bit line BLC on the first column 15.

After the read operation completes, the read controller 55 disconnects all bit lines from the sense amplifier (i.e., multiplexer 777 is deactivated) and the sense amplifier 50 is restored/reset. Read controller 55 then selects the second column 20 to connect the sense amplifier through the multiplexer 777. The differential signal on the true bit line BLT and the complement bit line BLC is sensed (i.e., read) by the sense amplifier. Once the read operation is completed, the read controller 55 disconnects all the bit lines from the sense amplifier (i.e., multiplexer 777 is deactivated) and the sense amplifier 50 is restored/reset. The wordline driver 35 turns off and the word line goes low. With the burst read operations complete, the bit lines 15, 20, 25, and 30 are restored. The memory is now ready for the next command as the bit lines and sense amplifier are restored and the word line is deactivated.

In contrast, in the conventional circuitry of a SRAM read operation, the SRAM needs to activate the word line WL and discharge and precharge the bit line BL multiple times (i.e., each time that a column is being read and sensed), instead of just once in the present disclosure. Therefore, the conventional circuitry of the SRAM read operation burns more word line WL and bit line BL power than the present disclosure (i.e., approximately N−1 times more power, where N is the number of times the word line WL is activated and the bit line BL is precharge and discharged). Also, in the conventional circuitry of the Mux-X (i.e., X read operations) static random access memory, the word line WL needs to be activated X times and discharging and precharging needs to be performed X times. Therefore, in the conventional circuitry of the Mux-X, X−1 more burns for the word line WL and bit line switching power is required in comparison to the present disclosure. Further, the power in the conventional circuitry may also be reduced by the bit line pairs being discharged and precharged for each read operation.

Figure 2:
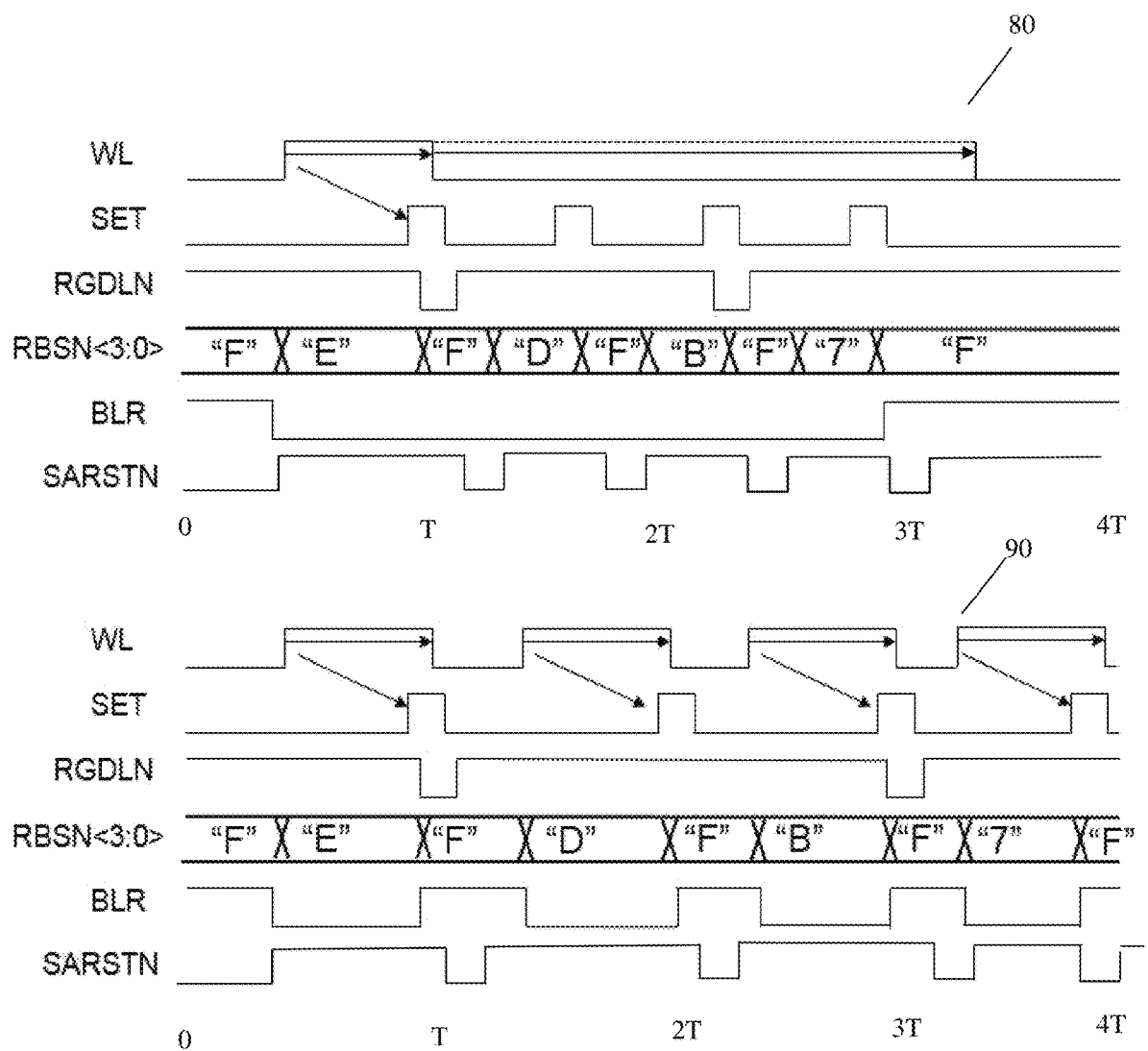
FIG. 2 shows timing diagrams of the multiplexer static random access memory read operation in comparison to a conventional timing diagram in accordance with aspects of the present disclosure.

FIG. 2 shows timing diagrams of the multiplexer static random access memory read operation in comparison to a conventional timing diagram in accordance with aspects of the present disclosure. More specifically, a timing diagram of the multiplexer static random access memory read operation is represented at reference numeral 80 and a conventional timing diagram of a static read access memory operation is represented at reference numeral 90.

FIG. 2 shows a comparison of a conventional read operation and a burst mode read operation, assuming four sequential read operations occur (i.e., reference numeral 90). In FIG. 2, WL is a row word line and SET is the sense amplifier set signal, which takes a differential voltage from the true bit line BLT and the complement bit line BLC and outputs a full differential signal used as the data out from the memory. Further, RGDLN is the read global data line N (active low), which is dependent on the data being sensed by the sense amplifier.

In FIG. 2, when RGDLN transitions to a "0", this is reading a "1". Further, if RGDLN transitions to a "1" after a SET, this is reading a "0". RBSN<3:0> is the read bit switch N (active low), which comprises the multiplexer select signals that connect one pair of bit lines to the sense amplifier.

Since the signal is active low, the HEX values of F corresponds to all bit lines disconnected from the sense amplifier (since all bits are a "1"). However, when RBSN is HEX E (i.e., binary 1110), the first column 15 is connected to the sense amplifier 50. When RBSN is HEX D (i.e., binary 1101), the second column 20 is connected to the sense amplifier.

When RBSN is HEX B (i.e., binary 1011), the third column 25 is connected to the sense amplifier 50. When RBSN is HEX 7 (i.e., binary 0111), the fourth column 30 is connected to the sense amplifier 50 of FIGS. 1A, 1B. BLR refers to the bit line restore and is used to precharge/reset the bit lines to a known voltage which corresponds to a logical "0". SARSTN is the sense amplifier restore N (active low) and is used to restore/reset the sense amplifier 50, 60, and 70 of FIGS. 1A, 1B. Four arbitrary clock periods T, 2T, 3T, and 4T are shown for a conventional read operation (i.e., reference numeral 90) and a burst mode read operation of the present disclosure (i.e., reference numeral 80).

In the conventional read operation (i.e., reference numeral 90), a word line WL is activated and the bit switch multiplexer RBSN connects the first column 15 to the sense amplifier for a read operation. The bit line restore BLR is deactivated so that the bit cell outputs the data on the bit lines. The sense amplifier restore SARSTN is deactivated so that the sense amplifier can sense the data. A timing delay from the word line WL activation to the sense amplifier set signal SET is provided to develop sufficient signal. The SET going to a "1" completes the first read operation. In the conventional read operation (i.e., the reference numeral 90), the word line WL is deactivated, RBSN goes to an inactive state F (i.e., binary 1111), the bit line restore BLR is activated to put a "1" value on the true bit line BLT and the complement bit line BLC and the sense amplifier restore SARSTN goes to a "0" to restore/reset the sense amplifier. Further, to read the column 20, the sequence repeats on the next clock cycle and this sequence must repeat for each read operation.

In comparison, in a burst mode read operation of the present disclosure (i.e., reference numeral 80), a word line WL is activated once for four sequential read operations on a common word line. The word line WL is held active to continuously drive signal on the bit lines and avoid floating bit lines during the burst read operation. When the word line WL is active, the bit line restore BLR must be off to avoid contention and to do a read operation, the sense amplifier restore SARSTN must be inactive (i.e., "1"). A time delay occurs and the sense amplifier set signal SET goes high to read the first column 15 when the RBSN is HEX E.

When this read operation is complete, the RBSN goes to the HEX F, which disconnects the first column 15 from the sense amplifier. The sense amplifier restore SARSTN goes low to reset/restore the sense amplifier. Once restored, the RBSN is set to connect the second column 20 to the sense amplifier by receiving the HEX D. The word line WL is still active and drives the signal development further.

When this read operation is complete, the RBSN goes to the HEX F, which disconnects the second column 20 from the sense amplifier. The sense amplifier restore SARSTN goes low to reset/restore the sense amplifier. Once restored, the RBSN is set to connect the third column 25 to the sense amplifier by receiving the HEX B. When this read is complete, the RBSN goes to F, which disconnects the third column 25 from the sense amplifier. The SARSTN goes low to reset/restore the sense amplifier. Once restored, the RBSN is set to connect the fourth column 30 to the sense amplifier by receiving a HEX 7.

One of ordinary skill in the art would understand that the burst mode read sequence of adjacent columns activated by a column word line with signal being developed while the word line WL is activated can be sensed (i.e., read) faster than a conventional read operation. FIG. 2 shows that the four SET pulses (i.e., four read operations) in the reference numeral 80 are completed before the conventional read operations in the reference numeral 90.

As should be understood by these timing diagrams, the multiplexer static random access memory read operation 80 can save time (i.e., the word line WL to the set signal SET delay) when performing sequential read operations in a burst mode (as signal is already developed on the N+1 columns). Further, the multiplexer static random access memory read operation 80 improves performance over the conventional circuitry by using a burst mode to save the power associated with the bit line BL restore across the different MUX options in a same physical row. The multiplexer static random access memory read operation 80 also has high throughput in comparison to a single read operation by having several columns on a common word line WL with signal developed during a read operation.

More specifically, in FIG. 2, the x-axis includes timing periods 0, T, 2T, 3T, and 4T and the y-axis includes the word line WL, the sense amplifier set signal SET, a read global data line N RGDLN, a read bit switch N signal RBSN<3:0>, a bit line restore BLR, and a sense amplifier reset N signal SARSTN. In the timing diagram of the multiplexer static random access memory read operation 80, the word line WL goes high at a time between 0 and T and is held high for a predetermined number sequential read operations. For example, in the multiplexer static random access memory read operation 80, the word line WL is held high up to the 3T time period.

In the timing diagram of the multiplexer static random access memory read operation 80, when the word line WL is held high, the bit line restore BLR is held low to allow for read operations. During the read operations, the read bit switch signal RBSN<3:0> has four data outputs (i.e., "E", "D", "B", and "7") which are output in a burst mode before the time period 3T. In the timing diagram of the multiplexer static random access memory read operation 80, the address setup time and the word line WL to the set signal SET delay is saved for the next three column reads after a first column read.

In the conventional circuitry, the WL would be activated for the first column, the data of the first column would be read, the column address would be changed to point a bit switch to a next (i.e., second) column, the WL would be activated a second time, and the data of the second column would be read. This process is also repeated for the third and fourth column. In each of the read operations for each of the columns, an address setup timing and the word line WL to the set signal SET delay and bitline restore will have to be performed for the next column address. Accordingly and in contrast to the present disclosure, in the conventional timing diagram of a static read access memory operation 90, the word line WL must be asserted high four times for each read operation (i.e., to read 4 columns in a decode 4 architecture) and the bitlines restored high four times. Further, in the conventional timing diagram 90, after the word line WL is asserted, there is a delay until the set signal SET is asserted. For example, as shown in FIG. 1A, the bit line restore BLR is held low to allow for read operations (reading the cell drives data onto the bitlines). During the read operations, the read bit switch signal RBSN<3:0> has four data outputs (i.e., "E", "D", "B", and "7") which are output in a time period greater than the time period 3T. Accordingly, in comparison to the timing diagram 80, the conventional timing diagram of a static read access memory operation 90 requires more time to output the same data outputs because the word line WL must be asserted multiple times with a corresponding delay of the set signal SET.

FIG. 3 shows a control block system in the multiplexer static random access memory in accordance with aspects of the present disclosure. The control block system 100 includes the following components a decoding block 120; a first SR latch 130; a second SR latch 140; a gate 150; a delay 160; a set pulse generation block 170; a bitswitch0 signal generation block 180; a path selector 190; a block 200 to generate the latch activation signals; a first pulse generator 210; a second pulse generator 220; a third pulse generator 230; a counter and decoder 240; and a bit switch control block 250.

In operation of the control block system 100, when doing a N-sequential read operation (i.e., N read operations), the BURST_ENABLE signal is set to 1 and a row address is provided to the decoding block 120 of the static random access memory. The rising edge of BURST_ENABLE signal also sets the second SR Latch 140. A logical AND operation is performed on the output of the second SR Latch 140 and the BURST_ENABLE signal to generate the MUX_SELECT_0 signal. The MUX_SELECT_0 signal is set to a logical "1" which selects SET Pulse P1 to pass to L3_SET signal. The SET Pulse P1 comes from the delay 160, which delays the SET by a WL to Set Delay before being input to the set pulse generation block 170. The delay 160 is tuned to develop enough signal for the worst case cell (i.e., 6 sigma case) to read successfully. The set pulse generation block 170 also generates the SETN signal. The MUX_SELECT_0 signal is sent to a Bit Switch0 signal generation block 180 to select column 0 by default. The SETN signal feeds back to the second SR latch 140 and the output of the second SR latch 140 goes to "0", which turns the MUX_SELECT_0 signal to "0" such that the SET Pulse P2 is selected in the path selector 190 after the first read operation. The MUX_SELECT_0 signal being "0" causes the output of the Bit Switch0 signal generation block 180 (i.e., bit switch0 signal) to be a 0 (i.e., disabled), after the first column read.

Still referring to FIG. 3, the local signals within the control block system 100 are used to trigger a self-time interlocked mechanism which is then used to generate the pulses for the L3_SET and SALCLKN signals (i.e., sense amplifier latch enable signals) and SAPREN (sense amplifier precharge signals). The pulses generated from the control block are then buffered and sent across the bit fields to the sense amplifier and bit switches. The L3_SET signal goes to a first pulse generator 210, which outputs SALCK and SALCLKN signals used for data transfer out of the sense amplifier and back to the I/O block.

Further, SALCLKN signal goes to a counter and decoder 240 to increment the bit switch by 1 (i.e., select the next column) on each falling edge of SALCLKN. The counter and decoder 240 are timed such that the bit switch activations (e.g., bit switch1, bit switch2, bit switch 3) do not overlap with the SAPREN signal. SALCLKN also goes to a second pulse generator 220 to create SAPRE and SAPREN signals, which are sense amplifier precharge signals. In the static random access memory, the sense amplifier is precharged to prepare the next column for sensing. The SAPREN signal goes to the third pulse generator 230 and creates SET Pulse P2 signal.

Still referring to FIG. 3, the SET Pulse P2 signal is generated from the third pulse generator 230 and is generated immediately after receiving the feedback from the SAPREN signal. Therefore, there is no need to wait for a signal development time on the next three consecutive reads. Accordingly, in the present disclosure, the word line WL to the SET signal timing (i.e., the signal development time) is reduced for the next 3 (e.g., N) reads from the cycle time. Thus, the present disclosure provides a performance improvement by increasing the frequency of the N+1 sequential reads. Since MUX_SELECT_0 is now a "0" for the N+1 sequential reads, the L3_SET signal is selected from the SET Pulse P2 signal.

Still referring to FIG. 3, when bit switch3 goes to a "1" (i.e., after the third bit switch is closed), the bit lines BLs can be restored and the word line WL turned off. Bit switch3 goes to the bit switch control block 250 which sets the BLPREN signal to "0" (i.e., bit line precharge active low), sends a "1" to the WL fall pulse trigger signal to reset the first SR latch 130, deactivates the word line WL, and completes the sequential read sequence. The read latch CLK signals, which are output from the control block system 100, are used to output the read signals (e.g., Read 0, Read 1, Read, 2, and Read 3) through a plurality of latches.

In FIG. 3, the BURST_ENABLE signal is kept on while in burst mode. The decoding block 120 is used to generate a PULSE signal for the requested row to be read and the first SR latch 130 is set by the PULSE to initiate a WL pulse. The BURST_ENABLE signal also sets the second SR latch 140 that generates a rising edge of the MUX_SELECT_0. When the MUX_SELECT_0 is high (i.e., "1"), the delay 160 is enabled to delay the SET by a WL to SET Delay. After the WL to Set Delay is enabled by the delay 160, the SET Pulse P1 is generated by the set pulse generation block 170. The pulses SALCLKN (i.e., sense amplifier latch enable signal) and SAPREN (i.e., sense amplifier precharge signal) are generated based on an internal timer. The SALCLKN signal initiates a 2-bit counter (i.e., the counter and decoder 240) that counts the number of pulses of the sequencing operation. The output of the counter and decoder 240 generates the bit switch activations (e.g., bit switch1, bit switch2, and bit switch 3).

FIG. 3 further shows a falling edge of the SET Pulse P1 and the SETN signal being generated, which resets the second SR latch 140. Resetting the second SR latch 140 causes the MUX_SELECT_0 signal to fall low (i.e., "0") and the path of the SET Pulse P2 is selected at the path selector 190 to output the L3_SET signal. The L3_SET signal then causes the generation of the second set of pulses SALCLKN and SAPREN. The counter and decoder 240 generates the bit switch activations (e.g., bit switch 1, bit switch2, and bit switch3). The falling edge of the bit switch3 is used to trigger the reset of the bit switch control block 250 such that the word line WL is shut off by using the WL fall pulse trigger signal. Further, the reset of the bit switch control block 250 activates the bit line restore BLR signal to restore the bit lines. In FIG. 3, the signals (i.e., L3_SET, SALCKLN, SAPREN, and bit switch activations) are timed properly to ensure proper sequencing and functionality across all processes, voltages, and temperatures (PVTs).

Figure 4:
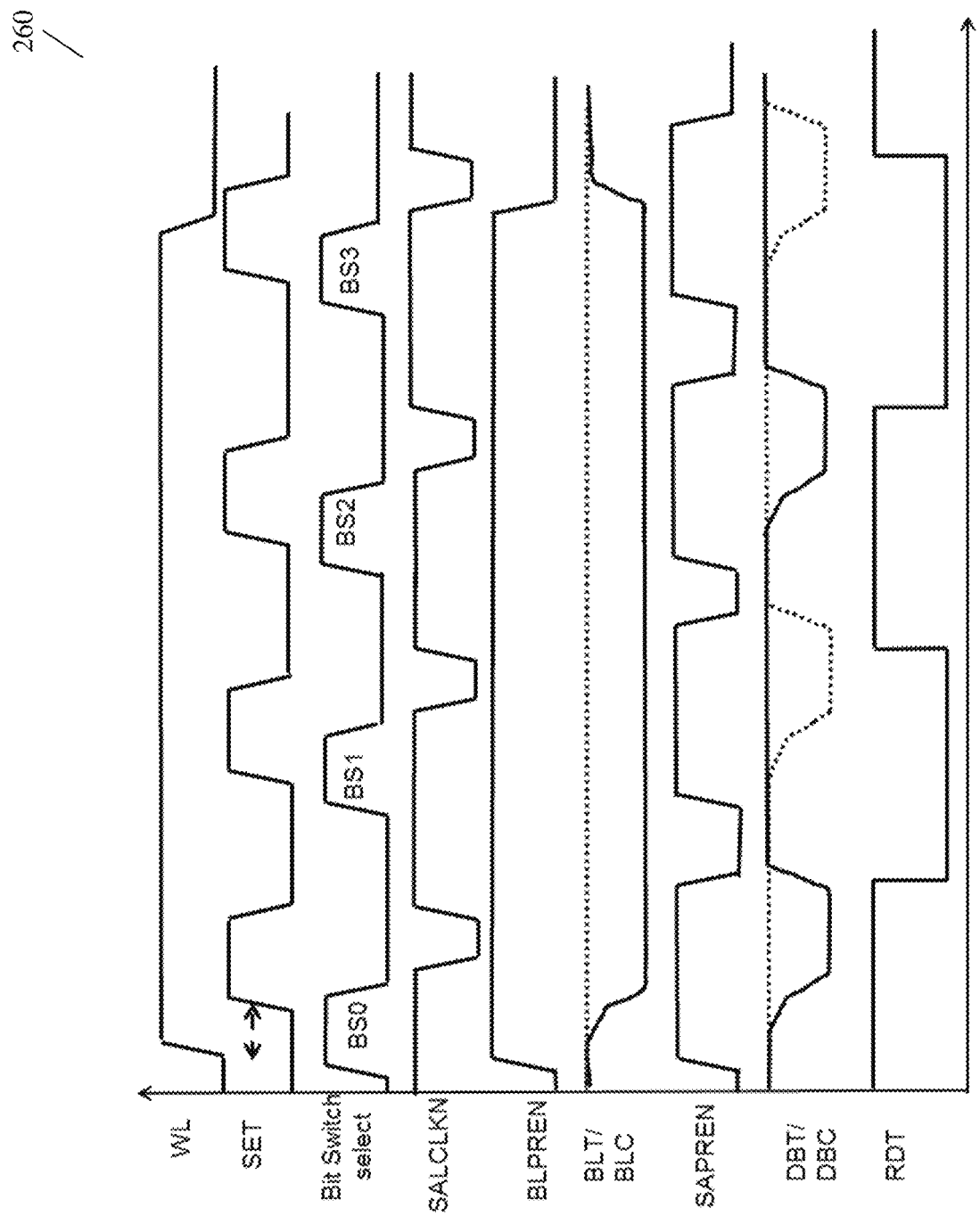
FIG. 4 shows waveform graphs of the multiplexer static random access memory read operation in accordance with aspects of the present disclosure.

FIG. 4 shows waveform graphs of the multiplexer static random access memory read operation in accordance with aspects of the present disclosure. The graph 260 also includes BIT LINES FOR EACH COLUMN, word line WL, Bit Switch BS0, BS1, BS2, BS3 for each of the columns, complement data bit line DBC AND true data bit line DBT, and RDT waveforms. In the graph 260 of FIG. 4, the word line WL is kept on for the entire duration of the sequential read operations to ensure better sigma for more differential (as indicated by the dashed line). Further, in the graph 260 of FIG. 4, the bit lines are no longer floating because the bit lines are not tied to VCS supplies, which depend upon cells storing a "1" or a "0".

In the present disclosure, a word line WL to the SET signal timing (i.e., the signal development time) is reduced for each sequential read operation after the first read operation based on the word line WL being kept high for the entire duration and the bit lines no longer being floated. In particular, once there is enough developed signal for the first read operation, there is no need for the word line WL to the SET signal delay on the subsequent operations. The word line is kept on the entire duration of the read operations, so there is no issue of signal development as the bit lines are already discharged for the subsequent read operations. Further, saving the word line WL to the SET signal delay is enabled by a self-timer circuit. In particular, the self-timer circuit uses a state machine to time the next read operations after the first read operation. Once the bit switch is activated for the desired columns, the SET signal can be turned on and there is no need to wait for the word line WL to the SET signal delay that occurred in the first read operation.

In contrast, in the conventional circuitry, the signal development time of each read operation is a significant portion of the cycle time. As an example, the signal development time of the conventional circuitry can be approximately 20% of the total cycle time. Therefore, when performing read operations in the conventional circuitry, the signal development time requires greater timing and power requirements than the present disclosure. The improvement in the READ time for the four consecutive reads is obtained by not having the signal development time for the next consecutive three reads, after the first conventional READ.

Using the conventional circuitry, when performing four read operations, the total read cycle time is approximately 4X (where X being the time for a single conventional READ operation). In this situation, 0.2X-0.4X is allocated for the word line WL to the SET signal delay in each of the read operations. In contrast, in the present disclosure, when performing four sequential read operations, the total read cycle time is approximately 3.4X-2.8X. Therefore, the read time savings for the delay in the present disclosure is approximately 15% to 30%.

Power savings occur in the present disclosure because there is no pre-charging of the bit line BL in every cycle (as required for the conventional circuitry). In the conventional circuitry, all of the bit lines (depending on the data stored in the bitcell, either BLT or BLC will discharge) are discharged during any single read operation for a memory decoding. In contrast, in a burst read operation of the present disclosure, all of the bit lines are discharged and charged at once. In a simulation of the conventional circuitry, using a four decode memory, the group of four bit lines would have discharged and pre-charged four times with a voltage of the discharge of the bit line being 0.38*VDD (where VDD is the supply voltage). In contrast, in a simulation of the present disclosure, as all of the four bit lines would have discharged and pre-charged only once, with the voltage of the discharged of the bit line being VSS (full rail discharge). In the simulation of the present disclosure, a conservative estimate is used in which all of the four bit lines are discharged all the way to ground. The power savings associated with this scheme can be formulated as follows, for the conventional READ operation the power associated with the BL restore is 4*4*VDD*Cbl*$\Delta$VBL, where $\Delta$VBL is the differential signal developed on the bit lines (i.e., 0.38 VDD). The first factor 4 is because we have 4 reads, and the next factor 4 is because on every single read for an inherent decode 4 architecture the 4 bit lines are discharged. In the sequential read mode, the bit lines are discharged all the way, and pre-charged only once. So the power associated with the switching is 4*VDD*VDD*Cbl. Therefore, in the present disclosure, the power savings is approximately 34.2%.

Figure 5:
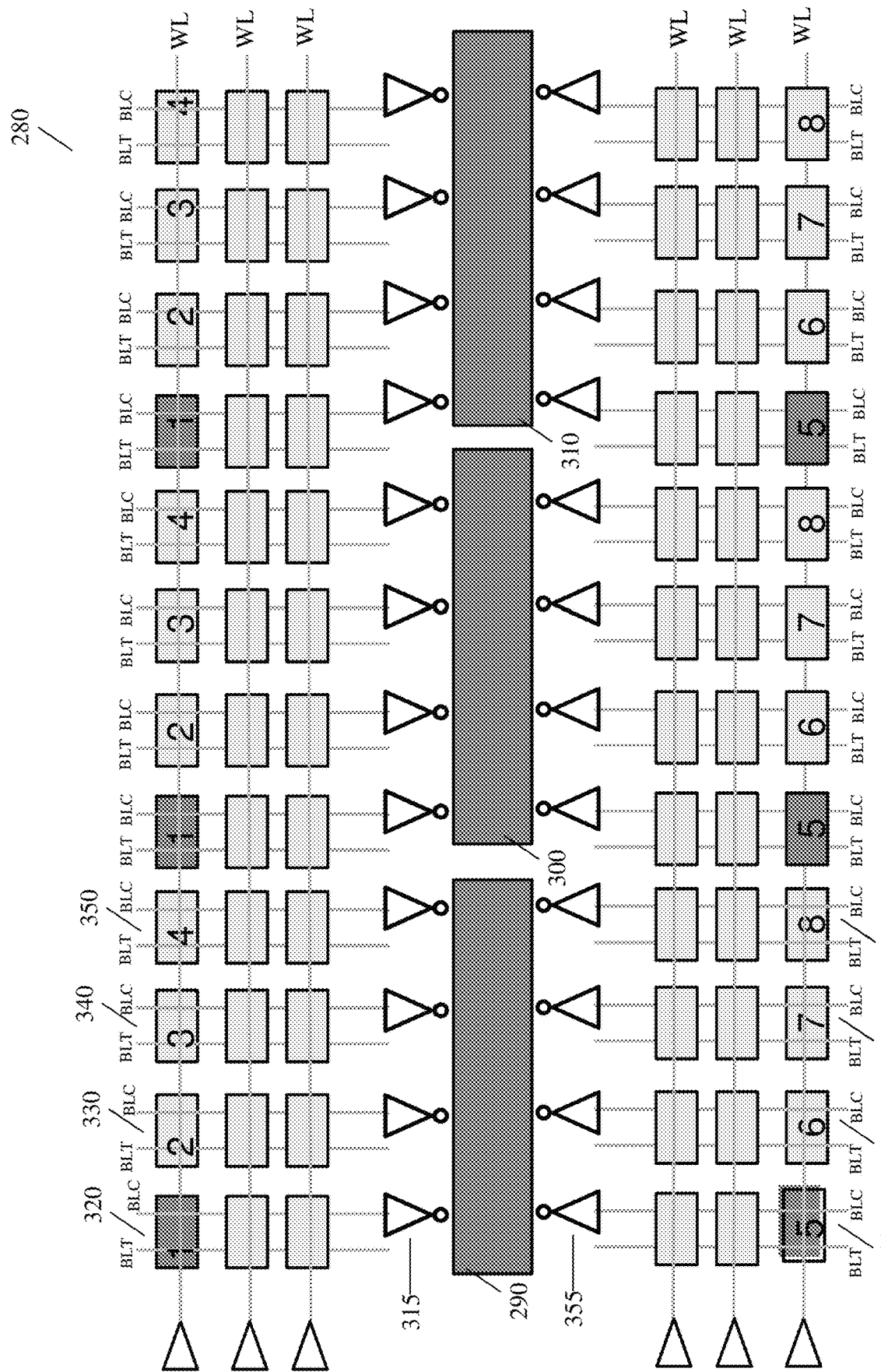
FIG. 5 shows a high decode domino sensing operation in accordance with aspects of the present disclosure.

FIG. 5 shows a high decode domino sensing operation in accordance with aspects of the present disclosure. The system 280 is utilized for shorter bit lines and domino-like sensing. Specifically, in FIG. 5, the system 280 for the high decode domino sensing operation includes an array. The array includes: a first column 320 (i.e., represented as "1"); a second column 330 (i.e., represented as "2"); a third column 340 (i.e., represented as "3"); a fourth column 350 (i.e., represented as "4"); a fifth column 360 (i.e., represented as "5"); a sixth column 370 (i.e., represented as "6"); a seventh column 380 (i.e., represented as "7"); and an eighth column 390 (i.e., represented as "8"). Further, as shown in FIG. 5, the system repeats the columns 320, 330, 340, 350, 360, 370, 380, and 390 for two more sets. The columns 320-390 also receive word line WL and bit lines BLT and BLC (i.e., true bit line and complement bit line).

The system 280 in FIG. 5 also includes a first multiplexer/serializer 290, a second multiplexer/serializer 300, a third multiplexer/serializer 310, a first set of inverters 315, and a second set of inverters 355. In a further embodiment, a customer logic can be placed next to at least one of the first multiplexer/serializer 290, the second multiplexer/serializer 300, and the third multiplexer/serializer 310.

In operation, the system 280 allows for low-power sensing by using inverters (i.e., the first set of inverters 315 and the second set of inverters 355) for read operations. Further, the system 280 allows for even lower effective capacitance for the read operations using the inverters. The system 280 also allows for serializing data to do easy multiplexing. Additional performance speedup and power savings is achieved because the sense amplifier restore can be eliminated by using domino sensing.

By way of example, in the operation of the system 280, a bit line is sent with a "0" value to an inverter to create a bit line differential. Further, based on the bit line differential, the system 280 can perform faster switching and sensing because simple inverters are used instead of sense amplifiers.

Figure 6:
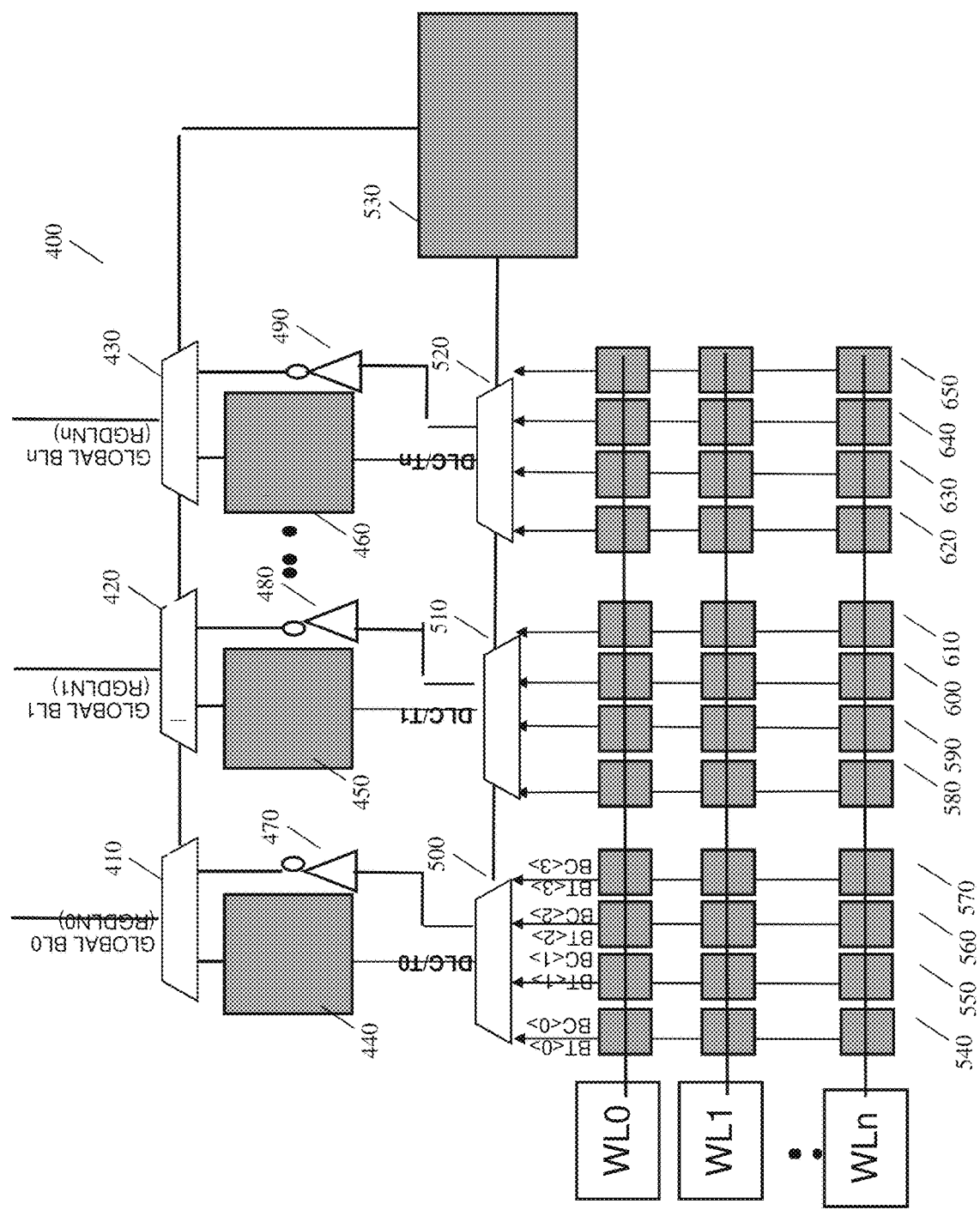
FIG. 6 shows a circuit diagram for the high decode domino sensing operation in accordance with aspects of the present disclosure.

FIG. 6 shows a circuit diagram for the high decode domino sensing operation in accordance with aspects of the present disclosure. In FIG. 6, the circuit 400 includes the following components: a first data selection logic 410; a second data selection logic 420; a third data selection logic 430; a first sense amplifier 440; a second sense amplifier 450; a third sense amplifier 460; a first inverter 470; a second inverter 480; a third inverter 490; a first multiplexer 500; a second multiplexer 510; a third multiplexer 520; a multiplexer select and steering logic 530; and an array. The array of the circuit 400 includes memory cells that are divided into columns. The columns include a first column 540, a second column 550, a third column 560, a fourth column 570, a fifth column 580, a sixth column 590, a seventh column 600, an eighth column 610, a ninth column 620, a tenth column 630, an eleventh column 640, and a twelfth column 650. In FIG. 6, each memory cell outputs a true bit line and a complement bit line for a column (e.g., BT<0> and BC<0>).

FIG. 6 is similar to FIGS. 1A and 1B; however, rather than all read operations being performed with sense amplifiers 440, 450, and 460, after the first read operation of a burst mode read sequence, enough signal will be developed on the bit lines of columns 20, 25, and 30 such that a simple domino sense operation using inverters 470, 480, and 490 can be used. In embodiments, a read controller 530 (i.e., the multiplexer select and steering logic 530) can control a multiplexer select on the multiplexers 410, 420, and 430 to pick either the sense amplifier or inverter path for data. In the event that the inverter path is selected, the sense amplifier should be in a restore/reset state and disconnected from the bit lines so as to not corrupt the data on the bit lines/bit cells. In other words, the multiplexers 500, 510, and 520 should not connect to the sense amplifiers 440, 450, and 460 and should only be connected to inverters 470, 480, and 490.

In an operation of FIG. 6, the first multiplexer 500, the second multiplexer 510, and the third multiplexer 520 are driven by the multiplexer select and steering logic 530 to select whether to send a bit line of the array to the first sense amplifier 440, the second sense amplifier 450, and the third sense amplifier 460, or to the first inverter 470, the second inverter 480, and the third inverter 490. For example, the multiplexer select and steering logic 530 can select whether the output from the first multiplexer 500 goes to the first sense amplifier 440 or to the first inverter 470 (or other sense amplifiers or inverter).

In FIG. 6, if the output from the first multiplexer 500 goes to the first sense amplifier 440, the output will be used for a first sensing (i.e., read) operation in a sequential burst read operation. If the output from the first multiplexer 500 goes to the first inverter 470, the output will be used for a fast sensing operation by developing a large differential signal on the bit line by holding the word line WL active throughout the series of sequential read operations. Further, in FIG. 6, the first data selection logic 410, the second data selection logic 420, and the third data selection logic 430 are used to set a global bit line. For example, the output Global BL0 (i.e., RGDLN0) from the first data selection logic 410 is selected based on the signal from the first inverter 470 and the first sense amplifier 440.

The circuit and method for a burst mode in a static random access memory to save power associated with address switching and decoding of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and method for a burst mode in a static random access memory to save power associated with address switching and decoding of the present disclosure has been adopted from integrated circuit (IC) technology. For example, the structures are built on wafers and are realized in films of material patterned by photolithographic processes on the top of a wafer. In particular, the fabrication of the circuit and method for a burst mode in a static random access memory to save power associated with address switching and decoding uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a sequential mode read controller which is configured to receive a sequential read enable burst signal and a starting word line address, identify consecutive read operations from an array of storage cells accessed via a plurality of word lines, precharge a plurality of bit lines of the storage cells no more than once during the consecutive read operations, and hold a word line of the plurality of word lines active throughout the consecutive read operations,
 wherein the sequential read enable burst signal and a starting word line address are decoded to select a row address and activate the corresponding word line from the plurality of word lines in the array,
 the sequential mode read controller comprises a set reset (SR) latch which receives a burst enable signal and an inverse set amplifier set signal and outputs a SR output signal to a multiplexer, and
 the multiplexer receives the SR output signal and the burst enable signal and outputs a mux output signal to enable a path selector.

2. The structure of claim 1, wherein the consecutive read operations comprise a burst mode for at least four read operations.

3. The structure of claim 2, wherein the consecutive read operations comprise reading a plurality of column addresses which are adjacent to each other and which are connected to a single sense amplifier.

4. The structure of claim 3, wherein the plurality of column addresses which are adjacent to each other are read in a sequential order.

5. The structure of claim 4, wherein the sequential mode read controller is configured to save power associated with column address switching and address decoding.

6. The structure of claim 5, wherein the power associated with column address switching and address decoding comprises power associated with the word line switching, updating latches, the address decoding, and power associated with bit line restore.

7. The structure of claim 6, wherein the sequential mode read controller is configured to iterate through the column addresses during the burst mode for sensing at least four read operations.

8. The structure of claim 1, wherein the read controller is configured to prevent the bit lines from floating by holding the word line active throughout the consecutive read operations.

9. The structure of claim 1, wherein the structure is a static random access memory (SRAM) which comprises a SRAM bit cell which drives data onto the bit lines based on the data stored in the SRAM bit cell such that only one of a true bit line and a complement bit line on a column will discharge towards ground during a read operation.

10. A circuit comprising,
 an array of storage cells arranged in a plurality of rows and a plurality of columns;
 a read controller configured to operate in a burst mode, precharge a plurality of bit lines of the storage cells no more than once during consecutive sequential read operations, and hold a word line of a plurality of word lines active throughout the consecutive sequential read operations,
 wherein the plurality of word lines correspond to the rows and the bit lines correspond to the columns,
 the read controller comprises a set reset (SR) latch which receives a burst enable signal and an inverse set amplifier set signal and outputs a SR output signal to a multiplexer, and
 the multiplexer receives the SR output signal and the burst enable signal and outputs a mux output signal to enable a path selector.

11. The circuit of claim 10, wherein the read controller is further configured to receive a precharge signal, a starting row address, and a word line pulse signal.

12. The circuit of claim 11, wherein the read controller is further configured to identify the consecutive sequential read operations from the array of storage cells accessed via the plurality of word lines.

13. The circuit of claim 12, wherein the read controller is configured to save power associated with column address switching and address decoding.

14. The circuit of claim 10, wherein the read controller is configured to prevent the bit lines from floating by holding the word line active throughout the consecutive read operations.

15. The circuit of claim 10, wherein the circuit is a static random access memory (SRAM) which comprises a SRAM bit cell which drives data onto the bit lines based on the data stored in the SRAM bit cell such that only one of a true bit line and a complement bit line on a column will discharge towards ground during a read operation.

16. A method, comprising:
 operating a static random access memory (SRAM) in a burst mode;
 precharging a plurality of bit lines in the SRAM no more than once during consecutive sequential read operations; and
 holding a word line of a plurality of word lines active throughout the consecutive sequential read operations,
 wherein the operating the SRAM in the burst mode comprises:
  receiving a burst enable signal and an inverse set amplifier set signal at a set reset (SR) latch of the SRAM;
  outputting a SR output signal from the SR latch to a multiplexer of the SRAM,
  receiving the SR output signal and the burst enable signal at the multiplexer, and
  outputting a mux output signal from the multiplexer to a path selector to enable the path selector.

17. The method of claim 16, wherein the operating the SRAM in the burst mode further comprises:
 performing a first read operation in a first column of an array of the SRAM using an address setup timing; and
 performing a second read operation in a second column of the array, which is adjacent to the first column of the array of the SRAM, while eliminating the address setup timing,
 wherein the second read operation is a domino sensing read which provides a lower power and faster read operation than the first read operation by eliminating a sense amplifier restore signal for resetting and restoring a sense amplifier of the SRAM.

18. The method of claim 17, further comprising performing a third read operation in a third column of the array, which is adjacent to the second column of the array of the SRAM, while eliminating the address setup timing.

19. The method of claim 18, wherein the third read operation is another domino sensing read which provides the lower power and faster read operation than the first read operation by eliminating the sense amplifier restore signal for resetting and restoring the sense amplifier of the SRAM.

20. The method of claim 17, wherein the domino sensing read provides the lower power and faster read operation by inverting a value of a bit line to create a bit line differential instead of using the sense amplifier restore signal for resetting and restoring the sense amplifier of the SRAM.

* * * * *